United States Patent [19]

Allen, III et al.

[11] Patent Number: 5,155,433

[45] Date of Patent: Oct. 13, 1992

[54] METHOD AND APPARATUS FOR TESTING BIPOLAR MAGNETS HAVING A CIRCULAR CURVATURE

[75] Inventors: Earl B. Allen, III, Pleasanton; Steven L. Kaczeus, San Jose; Charles T. Bobek, Lathrop, all of Calif.

[73] Assignee: Conner Peripherals, Inc., San Jose, Calif.

[21] Appl. No.: 673,643

[22] Filed: Mar. 22, 1991

[51] Int. Cl.[5] .................... G01R 33/02; G01R 33/12; G01N 27/72
[52] U.S. Cl. ..................................... 324/205; 324/262
[58] Field of Search .................... 324/205, 210–212, 324/262

[56] References Cited

U.S. PATENT DOCUMENTS 4,465,975 8/1984 Porter .................................. 324/205

Primary Examiner—Walter E. Snow
Attorney, Agent, or Firm—Fleisler, Dubb, Meyer & Lovejoy

[57] ABSTRACT

A bipolar magnet as used in magnetic disk drives is characterized by measuring field strength of the magnet along a plurality of radii using a Hall effect sensor which is incrementally indexed across the magnet by a stepper motor. The gap field strength, pole transitions, and null zone can be determined from combinations of the measurements along the plurality of radii.

13 Claims, 3 Drawing Sheets

METHOD AND APPARATUS FOR TESTING BIPOLAR MAGNETS HAVING A CIRCULAR CURVATURE

BACKGROUND OF THE INVENTION

This invention relates generally to the testing of magnets as used in magnetic disk drives, and more particularly the invention relates to the testing of bipolar magnets.

Digital data is magnetically stored on the surfaces of disks in a disk drive. The disks are rotated at high speed, and pick-up heads move across the surfaces of the disks for storing and accessing data in concentric tracks on the disk surfaces. The pick-up heads are mounted on the ends of arms extending from an actuator which rotates the arms and heads to select a track. The actuator includes a voice coil which is placed in a magnetic field, and the actuator rotates in response to energization of the coil by the passage of current through the coil windings.

The energization of the coil in moving the pick-up heads to a desired track is controlled by a programmed computer. The program is designed to tolerate some non-uniformity in the magnets. However, it is desireable to ascertain the characteristics of the magnets prior to use in a disk drive. Moreover, by measuring the magnet characteristics, manufacturers of the magnets can modify the manufacturing processes to optimize the characteristics.

Heretofore, a pair of unipole (e.g. a pole on each of two major surfaces) magnets have been used in driving the actuator coil. More recently, single bipolar magnets have replaced the pair of unipolar magnets. While the characteristics of a unipole magnet can be measured through use of a Helmholz coil, the Helmholz coil cannot be used with a bipolar magnet due to the cancelling affects of the poles. Further, bipolar magnets are unique in having a transition from one pole orientation to another on each major surface. The physical location of this transition on the surface of a magnet can vary. Additionally, a neutral or null zone surrounds the transition line due to domain disorientation on each side of the transition line which results in decreased magnetic performance of that area of the magnet.

Characteristics of magnets are established by the magnet manufacturing processes including rare earth powder blending, pressing, sintering and heat treatment, coating, and magnetizing. By monitoring the magnetic field strength, transitional line location, and neutral zone width, the manufacturing processes can be altered to attain optimal characteristics.

SUMMARY OF THE INVENTION

Accordingly, an object of the invention is apparatus for inspecting bipolar magnets.

Another object of the invention is a method of determining magnetic characteristics of a bipolar magnet.

Still another object of the invention is an improvement in manufacturing processes for bipolar magnets.

Yet another object of the invention is improved actuators in magnetic disc drives.

A feature of the invention is the use of a Hall sensor probe in measuring magnetic field strength along selected radii of a magnet.

Briefly, in accordance with the preferred embodiment of the invention, magnetic field strength is measured along three radii of a bipolar magnet including an inner radius, an outer radius, and a central radius. The measurements along the inner and outer radii are used to define the neutral zone and transition boundaries. The central radius is used to determine the overall magnetic field strength.

In carrying out the invention in accordance with a preferred embodiment, a stepper motor is used to accurately position the Hall sensor probe at a plurality of test points along each radius. All measurements are downloaded to a computer for processing and code generation.

The invention and objects and features thereof will be more readily apparent from the following detailed description and appended claims when taken with the drawings.

DETAILED DESCRIPTION OF ILLUSTRATIVE EMBODIMENTS

Figure 1:
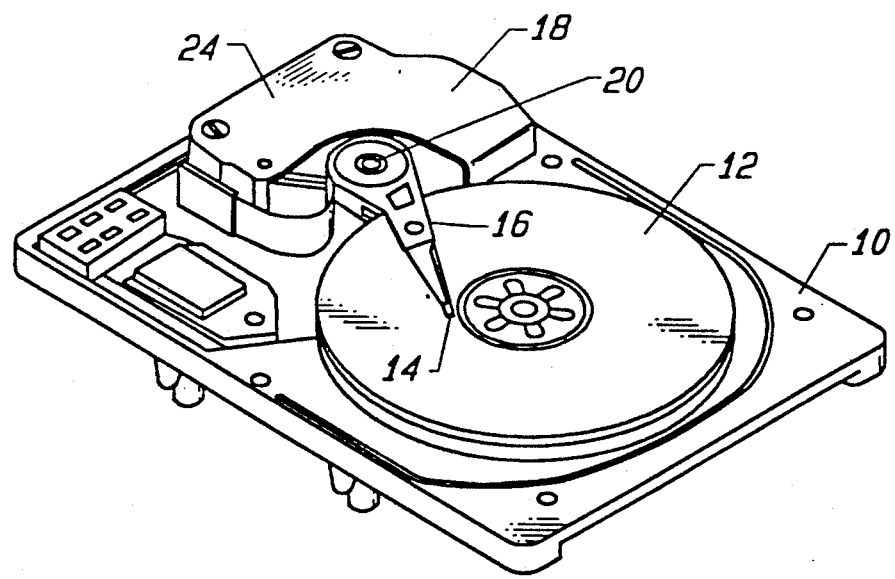
FIG. 1 is an isometric view of a disk drive illustrating the actuator therein.

Referring now to the drawing, FIG. 1 is an isometric view of a magnetic disk drive including a base 10 which supports a spin motor (not shown) on which are mounted a plurality of disks 12. As the disks are rotated by the spin motor, data is magnetically stored on surfaces of the disks by means of magnetic pick up heads 14 mounted on the ends of arms 16 which are attached to an actuator shown generally at 18. The actuator 18 includes a rotary mounted shaft 20 on which is mounted a voice coil (not shown) that is positioned in a magnetic assembly 22. Assembly 22 includes a bipolar magnet which establishes a generally uniform magnetic field in which the voice coil is positioned. By selectively energizing the voice coil, the actuator is rotated thereby moving the pickup heads 14 on concentric tracks on the surfaces of the disks for magnetic data access and recording.

Figure 2:
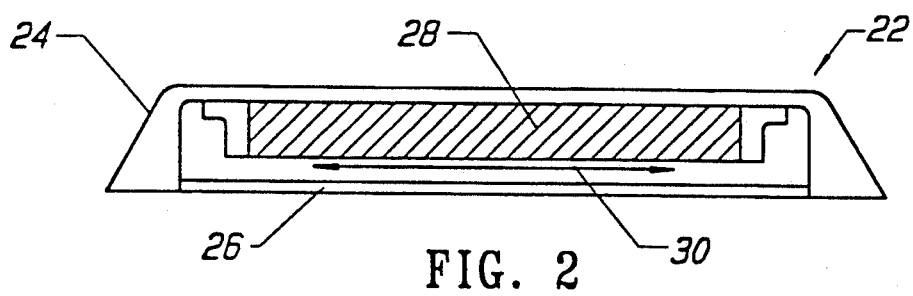
FIG. 2 is a front elevation view of the magnetic assembly for the actuator in FIG. 1.

FIG. 2 is a front elevation view of the magnetic assembly 22 which includes a top bracket 24 and a bottom bracket 26 which together define a magnetic path for flux from the bipolar magnetic shown at 28. Flux from magnet 28 crosses a gap to the bottom plate 26 and then through bracket 24 back to magnet 28. A gap is provided between the magnet 28 and the bottom bracket 26 in which the voice coil is positioned and linearly rotated as indicated by the arrow 30.

Figure 3:
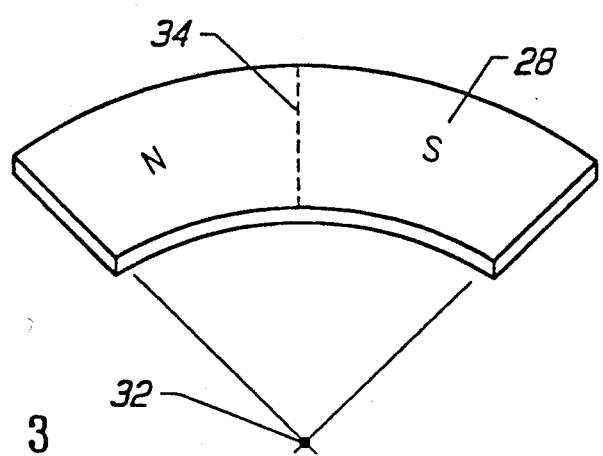
FIG. 3 is an isometric view of a bipolar magnet as used in the actuator of FIG. 1.

FIG. 3 is an isometric view of a bipolar magnet which has a curvature defined by a center of curvature at 32. The bipolar magnet has two magnetic poles (north, south) on each major surface as shown. The line of demarkation shown generally at 34 between the north pole and south pole of the exposed surface of magnet 28 is the transition line between the poles and should be generally positioned in the center of the magnet. A neutral or null zone surrounds the transition line due to magnetic domain disorientation on each side of the transition line and results in decreased magnetic performance of that area of the magnet. The null zone can increase or decrease in severity and width from one magnet to another.

In accordance with the invention the characteristics of a bipolar magnet are determined from magnetic measurements taken along radii of the magnet. The magnetic characteristics can be used in determining acceptable and unacceptable magnets for use in a disk drive, and the characteristics can be used by the magnet vendors in modifying their manufacturing processes.

Figure 4:
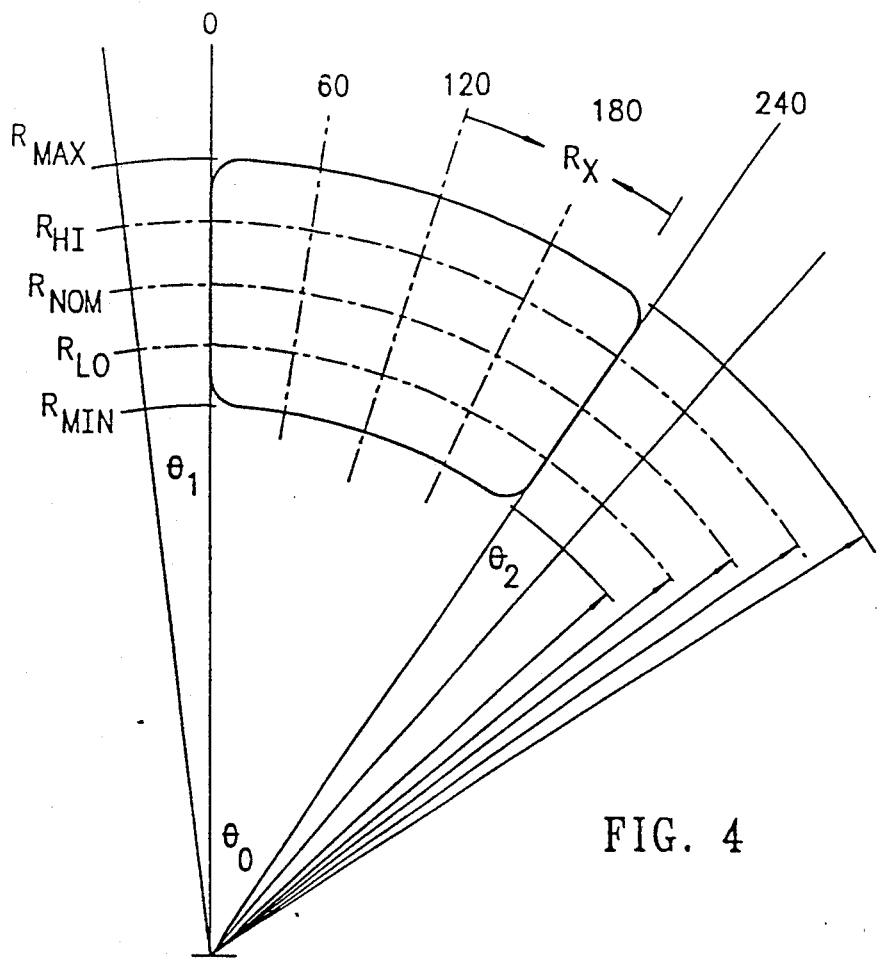
FIG. 4 is a plan view of a bipolar magnet illustrating radii thereof used in testing the magnet in accordance with the invention.

FIG. 4 is a top plan view of a magnet illustrating several radii including $R_{min}$, $R_{low}$, $R_{nom}$, $R_{hi}$ and $R_{max}$. In a two and one half inch disk drive, the radii are as follows:

$R_{min}$=0.420 inch
$R_{low}$=0.477 inch
$R_{nom}$=0.610 inch
$R_{hi}$=0.743 inch
$R_{max}$=0.800 inch In accordance with the invention a gaussmeter probe such as a Hall sensor is swept along a plurality of radii, and magnetic field strength is measured at equi distant points along each radius. Measurements are begun with the gaussmeter probe positioned at one edge of the magnet (position 0) and the probe is swept along the radius until the probe is positioned at the opposite edge of the radius (position 240). Two hundred and forty test points are provided between the two edges of the magnet. Thus, a total of 240 measurements are taken along each radius. From these measurements the peak value and location for each pole is determined and the overall gauss profile is determined for each radius. The transition between poles is the angular location calculated for measurements at the inner and outer radii, and the neutral zone is determined by the angular neutral zone widths of all three radii.

Figure 5:
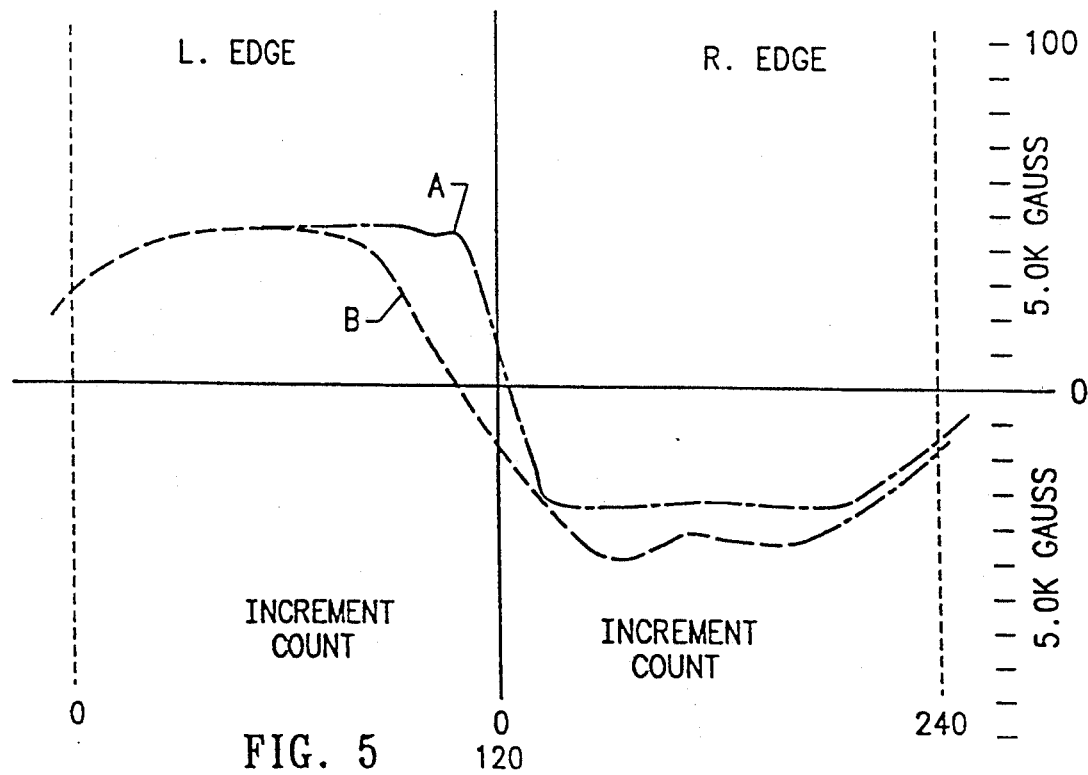
FIG. 5 is plot illustrating typical magnetic measurements for an acceptable bipolar magnet and for a magnet having domain disorientation.

FIG. 5 is a plot of measurements along one radius for two different magnets. The measurements start at index point 0 and proceed through index point 240 as described above with reference to FIG. 4. In curve A the pole strength is relatively uniform for both the positive and negative poles of the magnet, and the transition from one pole to the other occurs near the center of the magnet with a transition being relatively uniform. However, in measurement B the transition is more inclined and off center in the magnet. Further, the strength of the magnet is non-uniform between increment positions 120 and 220, and that the slope of curve B is less than is the slope of curve A in the transition region. By knowing the overall field strength as well as the transition and neutral zone boundaries, the manufacturer of the magnets can make suitable adjustments in the manufacturing processes to achieve optimum magnet characteristics.

Figure 6:
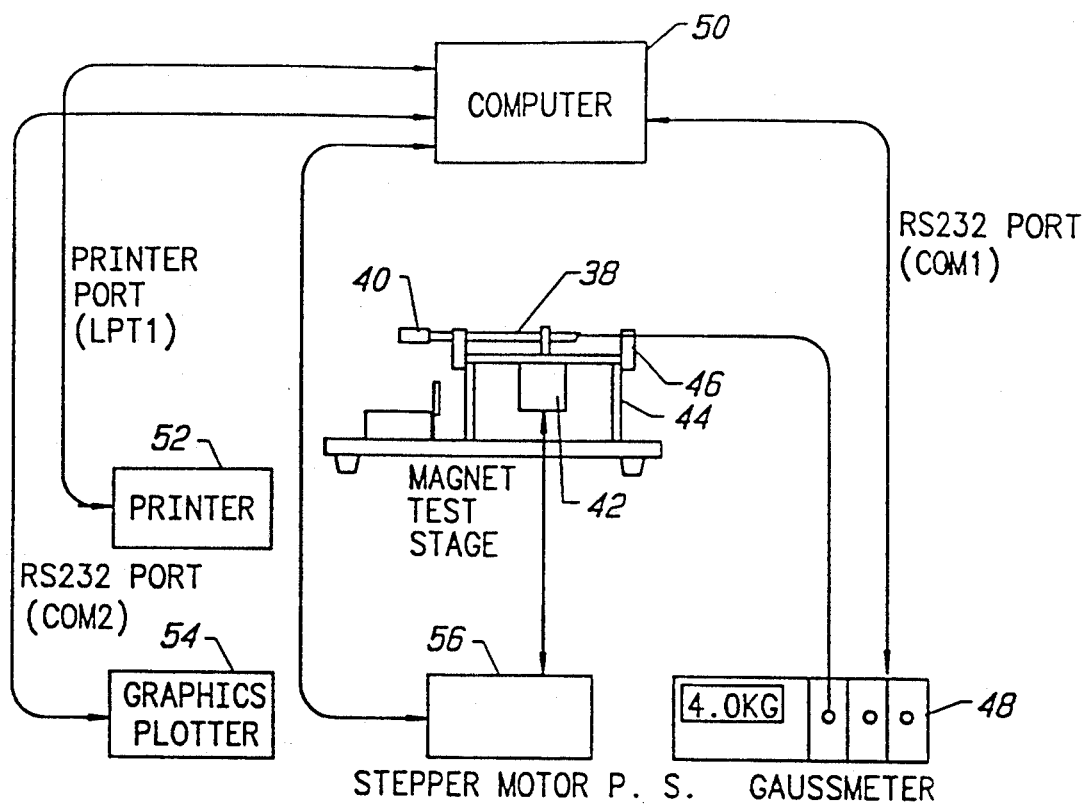
FIG. 6 is a functional block diagram of apparatus for inspecting a bipolar magnet in accordance with one embodiment of the invention.

FIG. 6 is a functional block diagram of one embodiment of equipment used in carrying out the method. The gaussmeter probe 38 includes a Hall effect device 40 mounted at one end with the other end being transversely affixed to the shaft of a stepper motor 42. The stepper motor is mounted on a frame 44 with limit switches 46 provided on either side of the frame 44 for limiting the movement of the gaussmeter probe 38. The gaussmeter probe is connected to a gaussmeter 48 which converts the measurements from the Hall effect device 40 into Kilo Gauss values. The gaussmeter 48 is connected to a computer 50 which controls a printer 52 and graphics plotter 54 for readout of the measured magnetic field strength. Computer 50 is also connected to the stepper motor power supply 56 for controlling the stepper motor during a test cycle. In one embodiment a Compac desktop computer was used.

Figure 7:
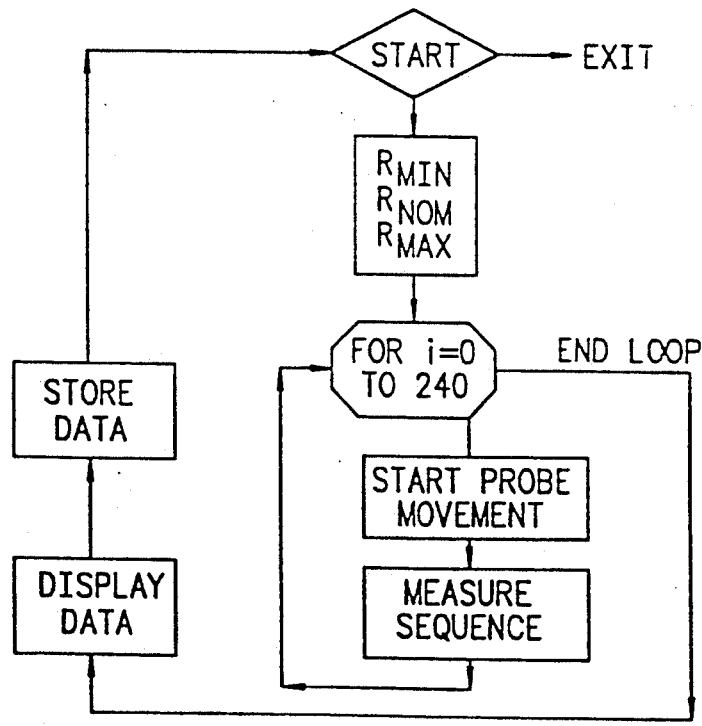
FIG. 7 is a flow diagram of a computer program used in controlling the apparatus of FIG. 6 in obtaining the measurements for the plots of FIG. 5.

FIG. 7 is a flow diagram of a control program for the stepper motor. The Hall effect device is positioned on the magnet radius to be traversed at position 0, and then the probe is moved incrementally from position 0 to position 240. At each position the probe is stopped and the flux density is determined by the Hall effect device. When the count reaches 240, the measurement sequence is completed and the probe movement is stopped. Data can then be displayed and stored while the probe is moved to another radius. After the probe has traversed $R_{min}$, $R_{nom}$, and $R_{max}$ the program is exited.

The method of characterizing a magnet using the measurement techniques in accordance with the invention has proved to be useful in magnet qualification and as feedback to vendors in modifying processes in fabricating the magnets. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of characterizing a bipolar magnet having a curvature defining a plurality of radii, for use in a disk drive actuator, comprising the steps of:
   a) placing the bipolar magnet in a magnetic assembly representing the magnetic circuit of a disk drive actuator with a gap provided corresponding to the gap for a voice coil;
   b) positioning a gaussmeter probe in the gap;
   c) moving the gaussmeter probe through the gap along a radius of the plurality of radii, along the magnet;
   d) obtaining field strength measurements at a plurality of distinct points along the radius; and
   e) determining gap field strength, pole transition, and null zone of the magnet from the measurements.

2. The method as defined by claim 1, wherein said step c comprises moving the gaussmeter probe along an innermost radius, an outermost radius, and a central radius, said step of determining gap field strength using central radius measurements, and said step of determining pole transitions and null zone using innermost radius and outermost radius measurements.

3. The method as defined by claim 1, wherein said step d comprises starting the gaussmeter probe along the radius off one edge of the magnet, and indexing the gaussmeter probe in equal increments, whereby the gaussmeter probe is sequentially positioned over each of the plurality of distinct points, to a stop position off another edge of the magnet.

4. The method as defined by claim 1 wherein said step b comprises positioning a Hall sensor.

5. Apparatus for use in characterizing a bipolar magnet having a circular curvature defined by a center of curvature and a plurality of radii, for use in a disk drive, comprising;
- a magnetic assembly representing the magnetic circuit of a disk drive actuator with a gap corresponding to the gap for a voice coil, said magnetic assembly for receiving the bipolar magnet;
- a stepper motor positioned substantially at the center of curvature and having a gaussmeter probe extending therefrom into said gap;
- control means for said stepper motor whereby said gaussmeter probe is incrementally indexed along one of the plurality of radii in said gap; and
- means connected to said gaussmeter probe for recording magnetic field strength as said gaussmeter probe is incrementally indexed.

6. Apparatus as defined by claim 5 wherein said gaussmeter probe comprises a Hall sensor.

7. Apparatus as defined by claim 6 wherein said control means includes a programmed computer.

8. The method as defined by claim 1 wherein the bipolar magnet further has a circular curvature defined by a center of curvature, said step c comprising placing a stepper motor substantially at the center of curvature and attaching the gaussmeter to the stepper motor, and said step d comprising indexing the stepper motor whereby the gaussmeter probe steps along the distinct points on the radius.

9. The method as defined by claim 1 wherein the bipolar magnet further has a circular curvature defined by a center of curvature, said step d comprising starting the gaussmeter probe at a first point on the radius, off one edge of the magnet, and indexing the gaussmeter probe in a predetermined number of equal increments along the radius to a first stop position off another edge of the magnet, the first stop position defining an angular distance around the center of curvature from said first point.

10. The method as defined by claim 8 wherein said step of positioning a gaussmeter probe in said gap includes positioning a Hall sensor.

11. The method as defined by claim 9 wherein said step c comprises moving the gaussmeter probe along an additional radius of said plurality radii, and said step d further comprises additionally starting the gaussmeter probe at a second point off one edge of said magnet lying on the additional radius, wherein the center of curvature, first point and second point define a line, and indexing the gaussmeter probe in the predetermined number of equal increments along the additional radius to a second stop position off another edge of the magnet, the second stop position being at the defined angular distance from the second point as measured around the center of curvature.

12. The method as defined by claim 2 wherein the bipolar magnet further has a circular curvature defined by a center of curvature, said step c comprising placing a stepper motor substantially at the center of curvature and attaching the gaussmeter to the stepper motor, and said step d comprising indexing the stepper motor, whereby the gaussmeter probe steps along the distinct points along each of the innermost radius, outermost radius and central radius.

13. A method of characterizing a bipolar magnet having a curvature defining a plurality of arcs, each arc associated with a radius, and a center of curvature, comprising the steps of:
a) positioning a gaussmeter probe at a predetermined distance from the magnet on a first arc of the plurality of arcs;
b) moving the gaussmeter probe relative to the magnet along the first arc in discrete steps at the predetermined distance from the magnet;
c) obtaining field strength measurements at a first plurality of discrete points on the first arc;
d) positioning a gaussmeter probe at the predetermined distance from the magnet on a second arc of the plurality of arcs;
e) moving the gaussmeter probe relative to the magnet along the second arc in discrete steps at the predetermined distance from the magnet;
f) obtaining field strength measurements at a second plurality of discrete points on the second arc, each discrete point of the second plurality of discrete points corresponding uniquely to a discrete point of the first plurality of discrete points, such that each discrete point of the second plurality of discrete points, the corresponding discrete point of the first plurality of discrete points, and the center of curvature, define a line; and
g) determining the characteristics of the null zone of the magnet from the measurements.

* * * * *